(12) United States Patent
Chen et al.

(10) Patent No.: US 7,372,087 B2
(45) Date of Patent: May 13, 2008

(54) SEMICONDUCTOR STRUCTURE FOR USE IN A STATIC INDUCTION TRANSISTOR HAVING IMPROVED GATE-TO-DRAIN BREAKDOWN VOLTAGE

(75) Inventors: Li-Shu Chen, Ellicott City, MD (US); Victor Veliadis, Midlothian, VA (US)

(73) Assignee: Northrop Grumman Corporation, Los Angeles, CA (US)

( * ) Notice: Subject to any disclaimer, the term of this patent is extended or adjusted under 35 U.S.C. 154(b) by 156 days.

(21) Appl. No.: 11/444,497

(22) Filed: Jun. 1, 2006

(65) Prior Publication Data

US 2008/0006848 A1  Jan. 10, 2008

(51) Int. Cl.
*H01L 29/80* (2006.01)

(52) U.S. Cl. ............... 257/263; 257/77; 257/E29.243; 438/192; 438/931

(58) Field of Classification Search ........... 257/77, 257/257, 263–267, 287, E29.242, E29.243; 438/192, 931
See application file for complete search history.

(56) References Cited

U.S. PATENT DOCUMENTS 5,967,795 A * 10/1999 Bakowsky et al. ......... 438/494
6,693,308 B2 * 2/2004 Sankin et al. ............... 257/103

* cited by examiner

*Primary Examiner*—Kiesha L. Rose
*Assistant Examiner*—Paul E Patton
(74) *Attorney, Agent, or Firm*—Andrews Kurth LLP (57) ABSTRACT

A structure for use in a static induction transistor includes a semiconductor body having first and second semiconductor layers on a substrate, with the second layer having a dopant concentration of around an order of magnitude higher than the dopant concentration of the first layer. A plurality of sources are located on the second layer. A plurality of gates are ion implanted in the second layer, an end one of the gates being connected to all of the plurality of gates and constituting a gate bus. The gate bus has an extension connecting the gate bus in the second layer of higher dopant concentration to the first layer of lower dopant concentration. The extension is ion implanted in either a series of steps or a sloping surface which is formed in the first and second layers.

7 Claims, 13 Drawing Sheets

SEMICONDUCTOR STRUCTURE FOR USE IN A STATIC INDUCTION TRANSISTOR HAVING IMPROVED GATE-TO-DRAIN BREAKDOWN VOLTAGE

CROSS REFERENCE TO RELATED APPLICATION

This application is related to an application entitled "Method of Making a Self Aligned Ion Implanted Gate and Guard Ring Structure For Use in a SIT", filed on Jun. 2, 2006, Ser. No. 11/445,215. This application is assigned to the assignee of the present invention and is intended to be incorporated herein by reference for any and all purposes.

BACKGROUND OF THE INVENTION

1. Field of the invention

The invention in general relates to semiconductors, and more particularly to a silicon carbide static induction transistor with high gate-to-drain breakdown voltage 2. Description of related art A typical SIT (static induction transistor) is a vertical structure semiconductor device wherein electrical current flows from a plurality of source regions to a drain region, on opposite sides of a substrate member. Current flowing from source to drain is controlled by a potential barrier induced by gate regions positioned between the sources. The region between the source and gates is known as the channel region, while the region between the bottom of the channel region and drain is known as the drift region.

Conventional SITs have a gate-to-drain breakdown voltage measurable in hundreds of volts. For many applications, however, it would be desirable to have a gate-to-drain breakdown voltage measurable in the thousands of volts. It is an object of the present invention to provide a semiconductor structure for use in a SIT wherein a gate-to-drain breakdown voltage in the thousands of volts is achieved.

SUMMARY OF THE INVENTION

A structure for use in a static induction transistor includes a semiconductor body having first and second semiconductor layers on a substrate, with the second layer having a dopant concentration of around an order of magnitude higher than the dopant concentration of the first layer. A plurality of sources is located on top of the second layer. A plurality of gates are implanted in the second layer, an end one of the gates being connected to all of the plurality of gates and constituting a gate bus. The gate bus has an extension connecting the gate bus in the second layer of higher dopant concentration to the first layer of lower dopant concentration.

Further scope of applicability of the present invention will become apparent from the detailed description provided hereinafter. It should be understood, however, that the detailed description and specific example, while disclosing the preferred embodiment of the invention, is provided by way of illustration only, since various changes and modifications within the spirit and scope of the invention will become apparent to those skilled in the art, from the detailed description.

BRIEF DESCRIPTION OF THE DRAWINGS

The present invention will become more fully understood from the detailed description provided hereinafter and the accompanying drawings, which are not necessarily to scale, and are given by way of illustration only, and wherein.

Similar reference characters refer to similar parts throughout the several Figs.

DESCRIPTION OF THE PREFERRED EMBODIMENTS

Although the invention is applicable to various semiconductor materials it will be described, by way of example with respect to a semiconductor structure utilizing SiC (silicon carbide). SiC is a preferred material over, for example silicon, since SiC exhibits higher breakdown voltage, lower thermal impedance due to superior thermal conductivity, higher frequency performance, higher maximum current, higher operating temperature, wider bandgap and improved reliability, particularly in harsh environments.

Figure 1:
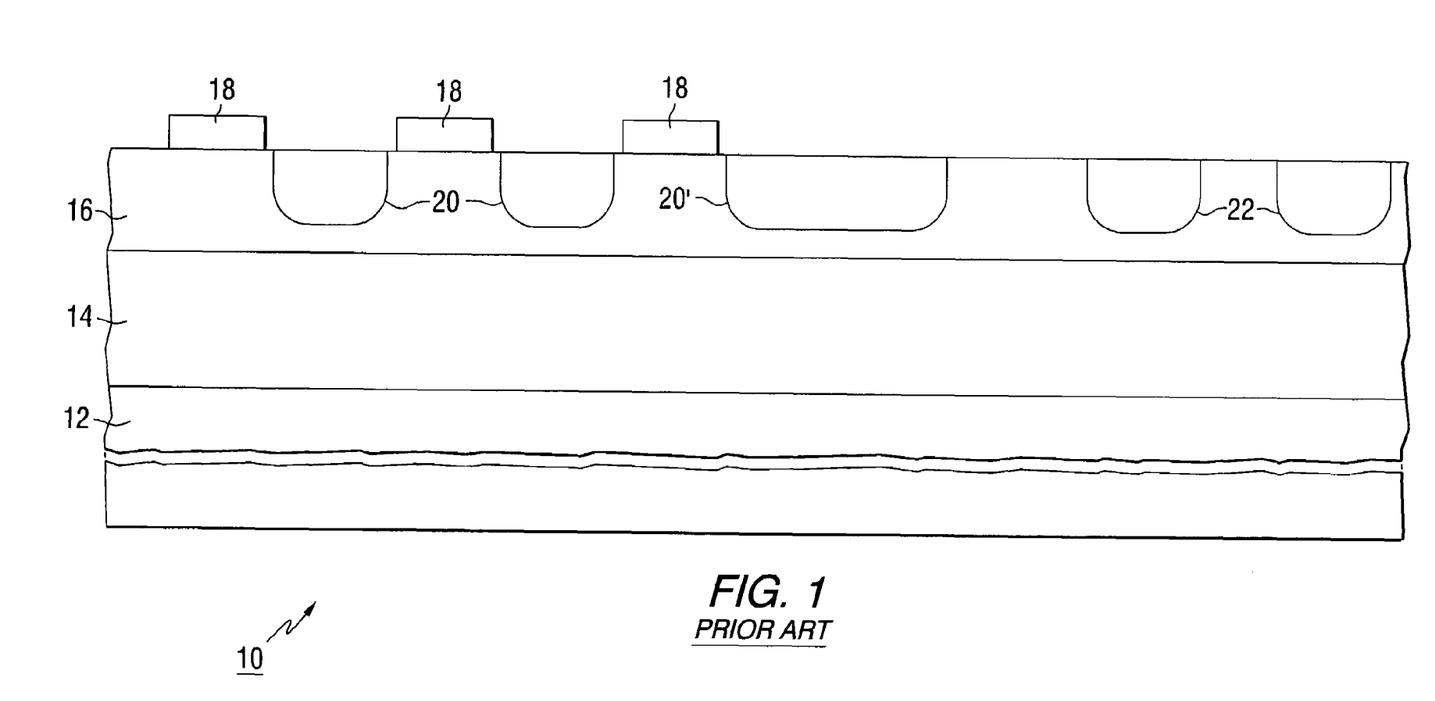
FIG. 1 is a cross sectional view of a typical prior art SIT structure.

In the SIT structure of FIG. 1 a semiconductor body 10 includes a SiC substrate member 12, upon which is deposited a plurality of SiC epitaxial layers. The layer which defines the drift layer has a different dopant concentration than the layer which contains the channel region. Accordingly, the body 10 of FIG. 1 includes a first layer 14, of an $n^{--}$ dopant concentration, constituting the drift region, a second layer 16 of an $n^-$ dopant concentration, constituting the channel region, and a third layer of an $n^{++}$ dopant concentration, which will form the source members 18 in the finished product. Typically, the drift region 14 may have a dopant concentration of around $1\text{-}6\times10^{15}$ atoms/cc, while the channel region 16 may have a dopant concentration of around $1\text{-}4\times10^{16}$ atoms/cc, an order of magnitude higher than that of the drift region.

Straddling the sources 18 is a plurality of ion implanted p+ gate regions 20 for controlling current from sources to the drain, constituted by substrate 12. In order to reduce the electric field concentration at the edge of the gate region and enhance the breakdown voltage of the device, a plurality of guard rings 22 is formed in layer 16.

Figure 2:
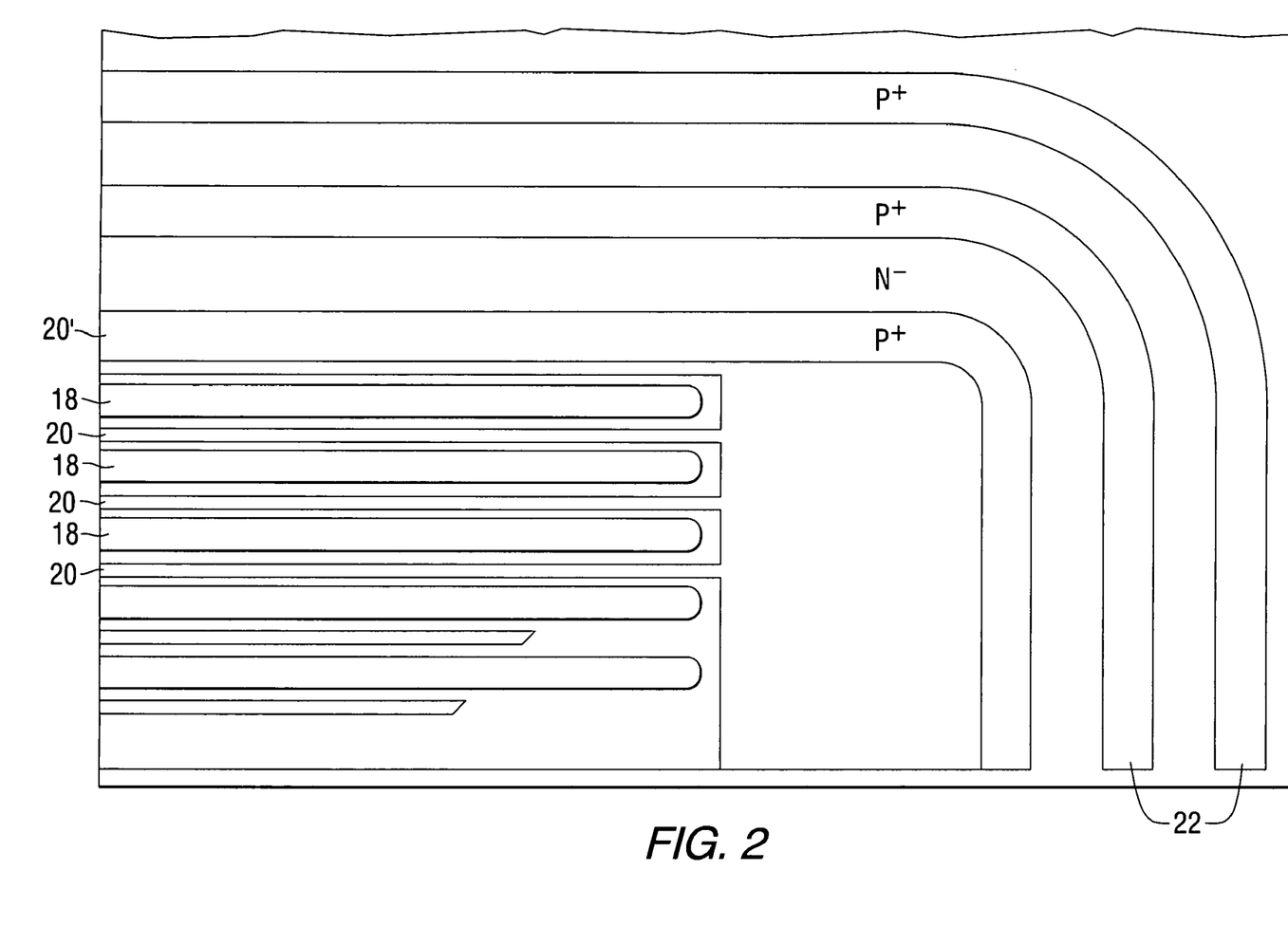
FIG. 2 is a plan view of the SIT of FIG. 1.

An end gate 20' extends around the front of the semiconductor structure and connects with all of the other gates 20. Accordingly, gate 20' may be considered as a gate bus. A plan view of the device is illustrated in FIG. 2 which shows the connection.

Due to the high dopant concentration of layer 16, the gate to drain breakdown voltage is severely limited, generally in the hundreds of volts range. Further, the p-n junction breakdown voltage between a gate and layer 16 is also a function of the dopant concentration of layer 16. A semiconductor structure fabricated in accordance with the present invention will advantageously allow for much higher gate-to-drain breakdown voltages, in the thousands of volts, and to this end, reference is made to FIG. 3, which illustrates the completed semiconductor structure.

Figure 3:
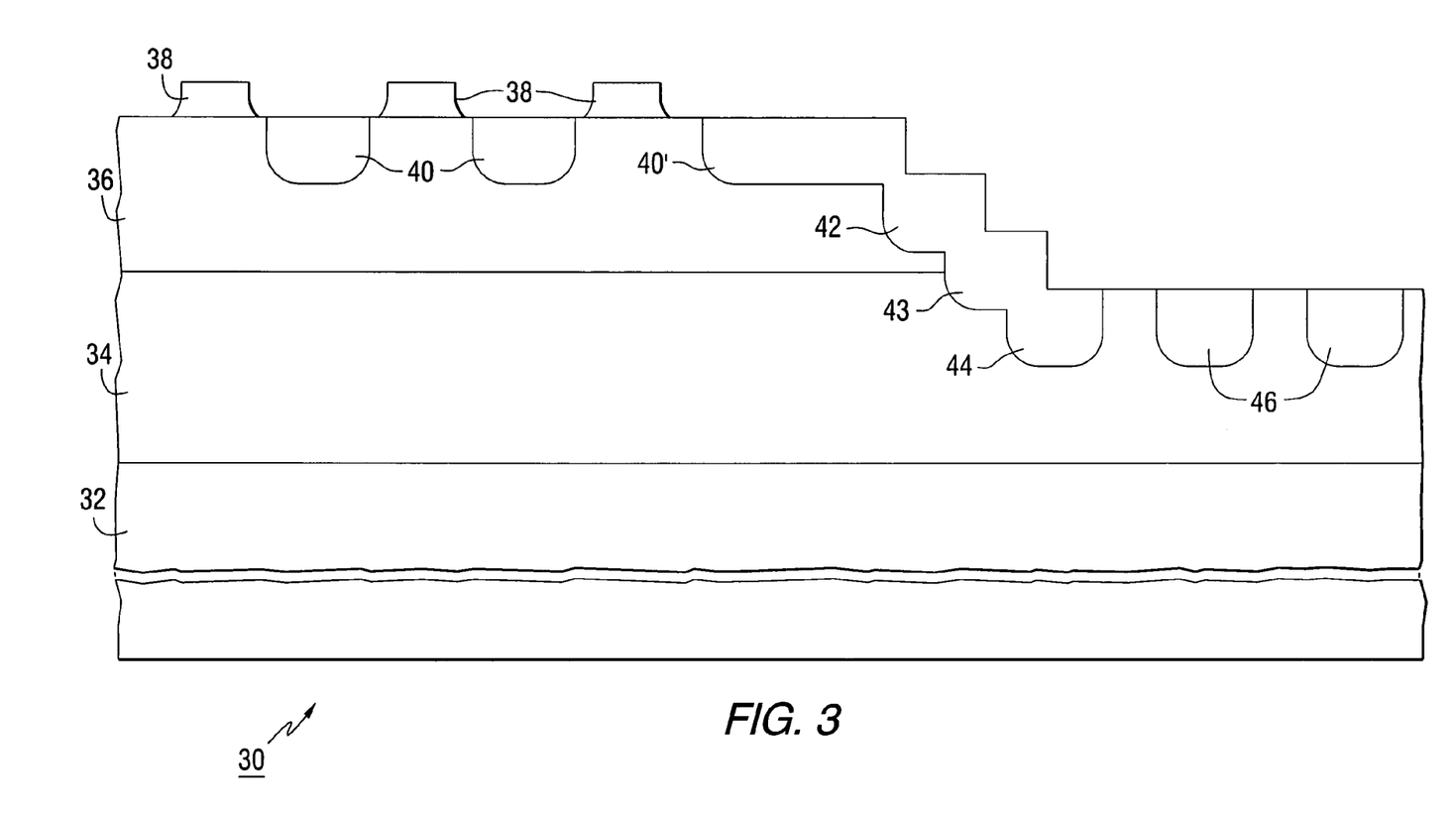
FIG. 3 illustrates a structure for use in a SIT, fabricated in accordance with the present invention.

The semiconductor structure is comprised of a semiconductor body 30 having a substrate 32, a first $n^{--}$ layer 34, a second $n^-$ layer 36, and a third layer of an $n^{++}$ dopant concentration, which will form the source members 38 in the finished product. P+ gate regions 40 are ion implanted, with an end gate 40' constituting a gate bus, similar to gate bus 20' of FIG. 1.

In the present invention the gate bus 40' is connected to layer 34, of lesser dopant concentration than layer 36, by ion implantations 42, 43 and 44. With this construction, the gate-to-drain breakdown voltage is significantly enhanced and is in the thousands of volts range as opposed to the hundreds of volts range. As before, guard rings 48 are included and are ion implanted in the first layer 34.

The gate bus 40' may be connected to the layer 34 of lesser dopant concentration in a number of ways, one of which is illustrated in FIGS. 4-9, to form single or multiple steps, by way of example. The gates are preferably formed by a self aligned ion implantation technique in accordance with the teachings as described and claimed in the above-referenced related application Ser. No. 11/445,215.

Figure 4:
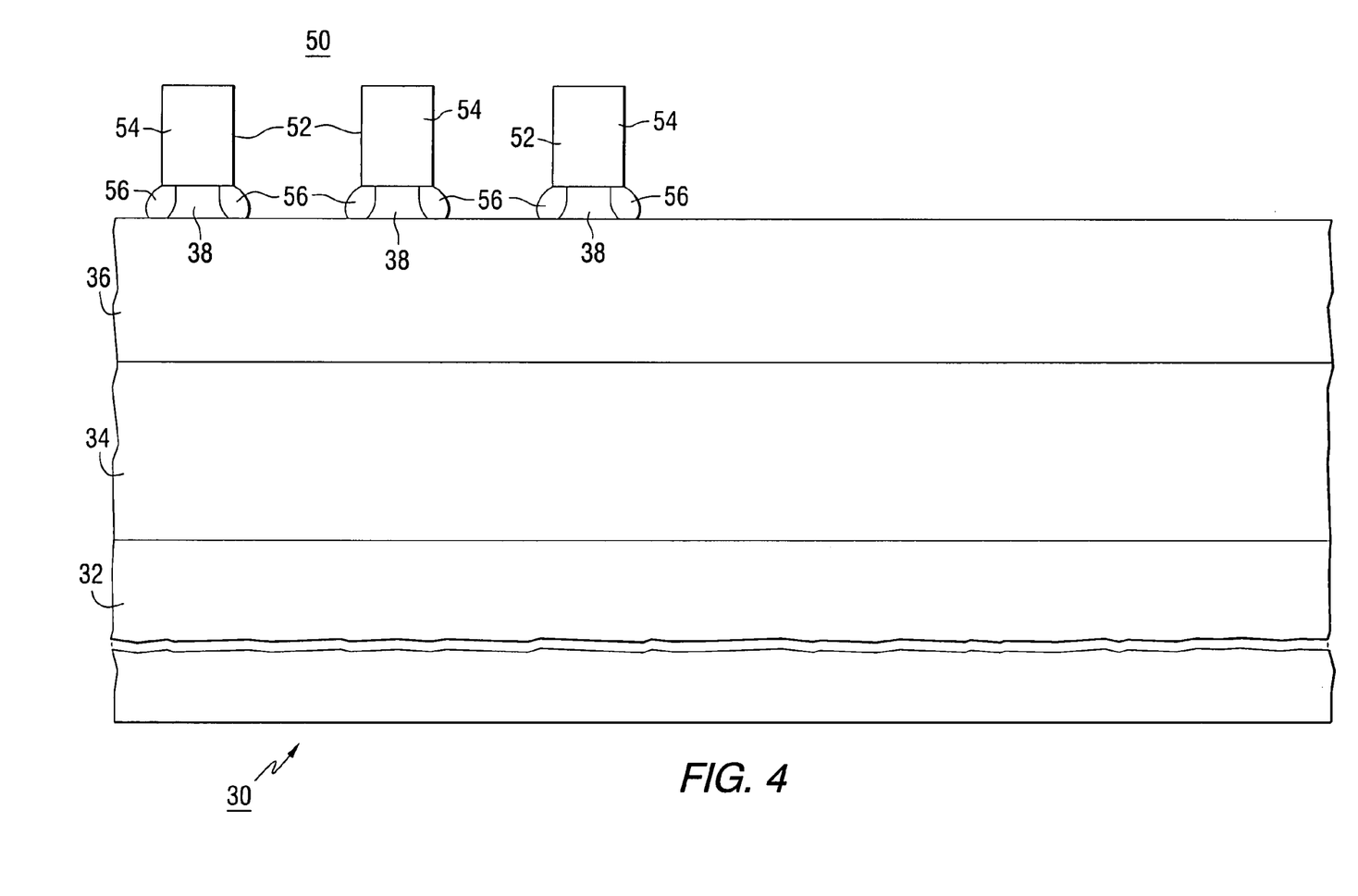
FIGS. 4-10 illustrate the fabrication technique in accordance with one embodiment of the invention.

Basically, an array 50 of pillars 52 is formed, as illustrated in FIG. 4. Each pillar 52 includes a thick oxide layer 54 deposited on top of the source 38 which remains after an etching step to remove the thick oxide between the pillars 52 and to remove the exposed remainder of the third layer. Details of the process are given in the aforementioned copending application. The body 30 is subjected to an oxidation in an oxidation furnace to grow oxide skirts 56 at the base of each pillar 52 and to consume a portion of the source 38.

Figure 5:
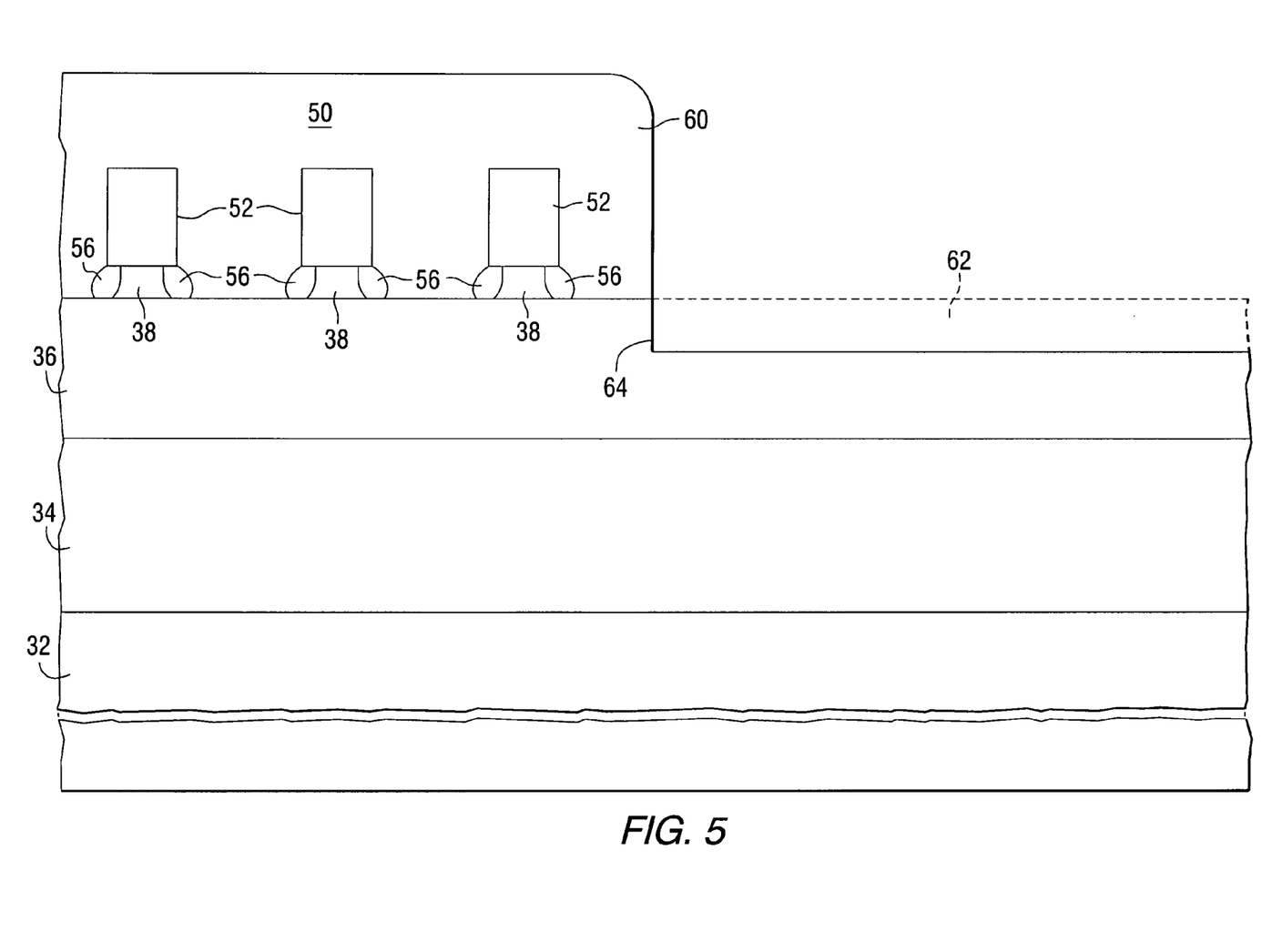

In accordance with one embodiment of the present invention a series of steps are formed to join the gate bus 40' (FIG. 3) with reduced dopant concentration layer 34. As illustrated in FIG. 5, a photoresist 60 is coated over the array 50 of pillars 52 and the structure is submitted to a RIE to remove portion 62 of layer 36, thus forming a first step 64.

Figure 6:
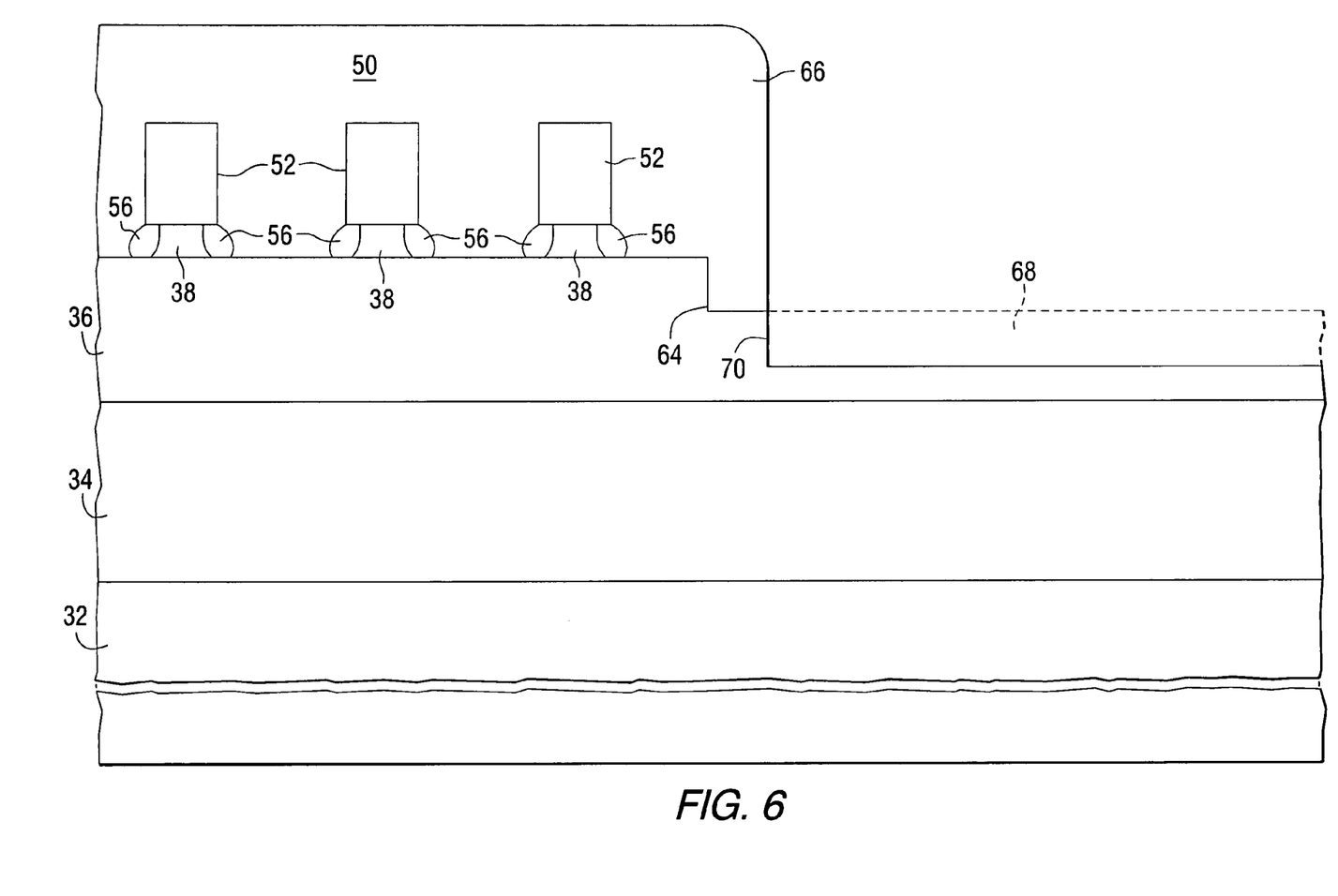
Figure 7:
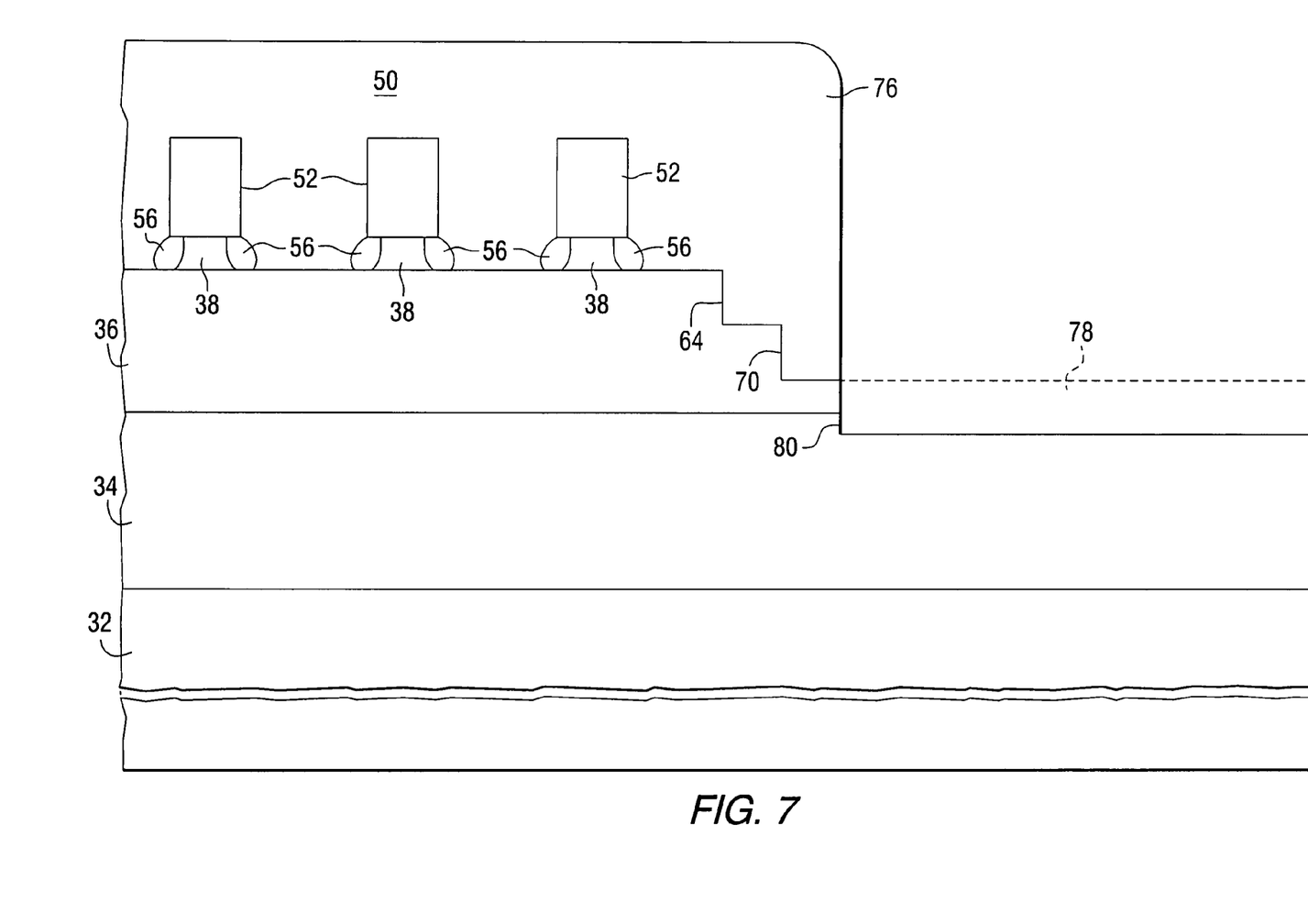

The photoresist 60 is removed, the structure cleaned and a next photoresist 66 is coated, as illustrated in FIG. 6. After a RIE, portion 68 of layer 36 is removed, thus forming a second step 70. After removal of photoresist 66 and cleaning, photoresist 76 is coated as illustrated in FIG. 7. A RIE removes portion 78 from layer 36 as well as layer 34 to form a third step 80.

Figure 8:
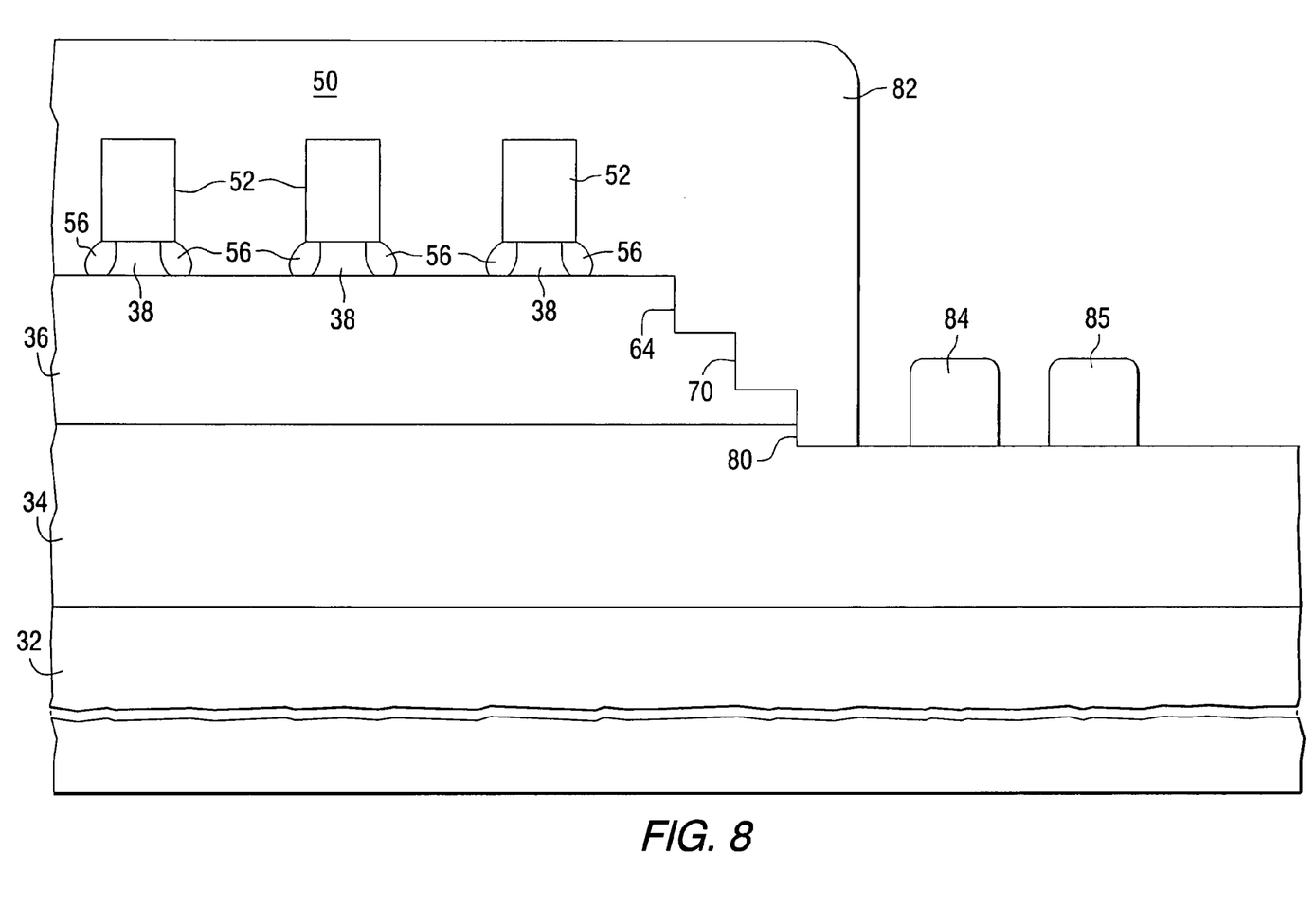
Figure 9:
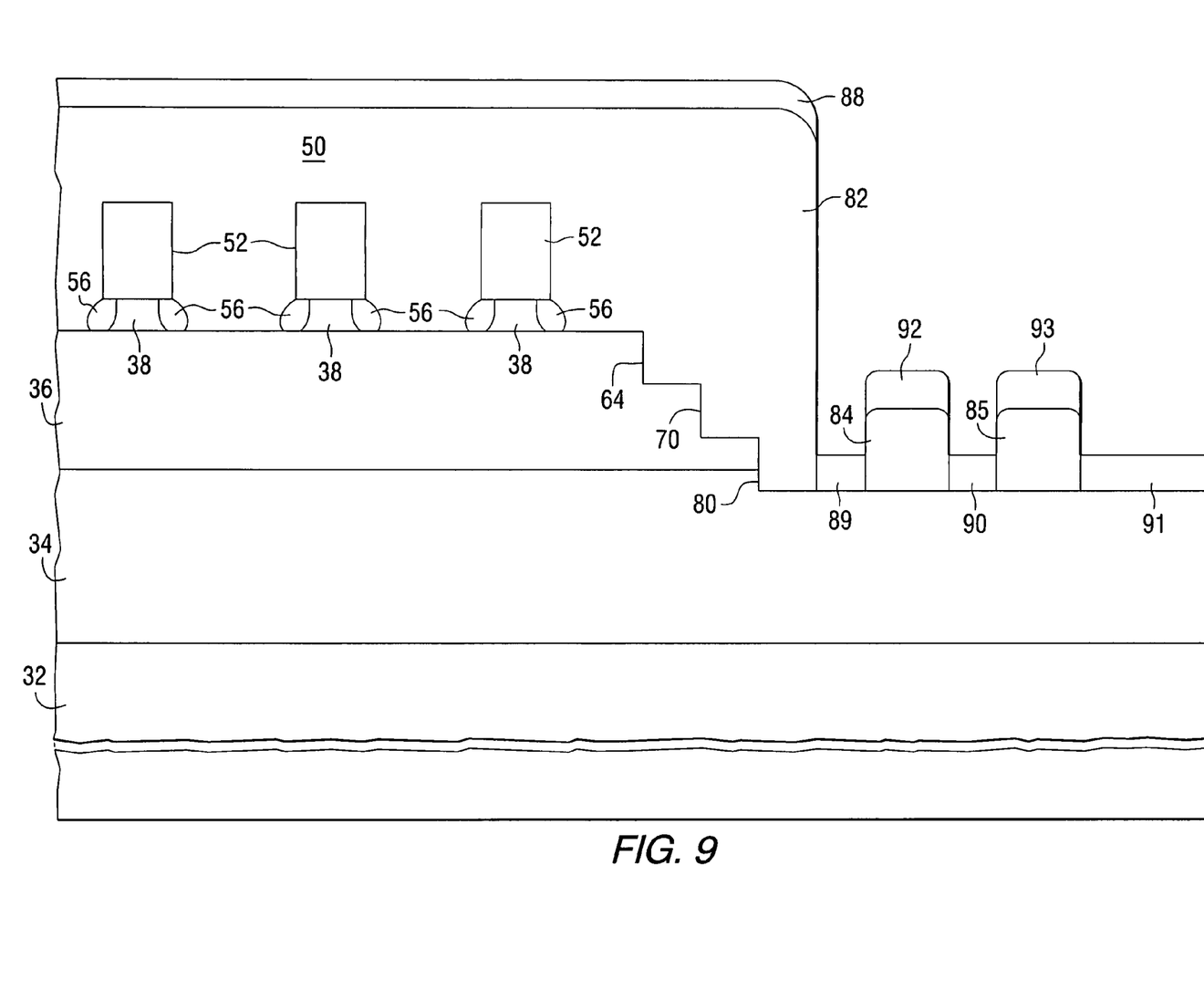

As indicated in FIG. 8, the next step involves a masking process whereby a photoresist 82 is applied over the array 50 of pillars 52. Also formed by the masking process are a plurality of concentric rings 84 and 85 of the photoresist which surround the array 50. A silicon monoxide layer 88 is then applied, as illustrated in FIG. 9, to cover the photoresist 82 which is over the array 50. In addition the silicon monoxide deposits on layer 34 as rings 89, 90 and end section 91, as well as over photoresist rings 84 and 85, the latter deposits being indicated by numerals 92 and 93.

The photoresists 82, 84 and 85 are then dissolved by a photoresist strip solvent. In the process, the dissolving photoresist also lifts off any silicon monoxide which is deposited on it thereby leaving the exposed pillars 52 and carbon monoxide concentric rings 89, 90 and end section 91 on layer 34, as illustrated in FIG. 10.

Figure 10:
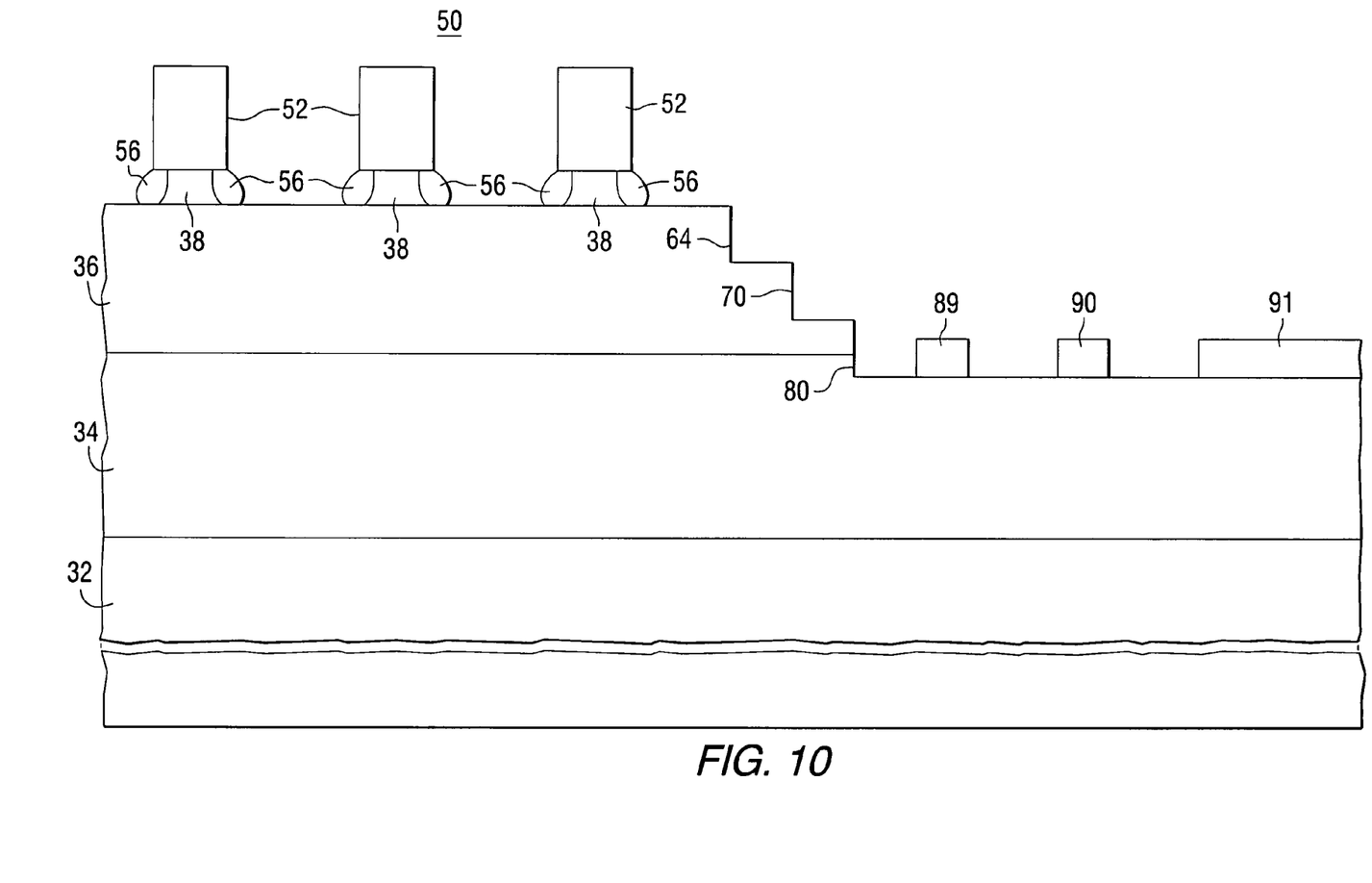

The structure of FIG. 10 is then ready for gate and guard ring formation by ion implantation using, for example, boron, aluminum, or a combination of the two. Ion implantation of p+ gates 40 (FIG. 3) is accomplished without the requirement for any masking operation, thus eliminating any potential for misalignment. Oxide skirts 56 ensure that the implanting ions are confined to the space between adjacent skirts 56 and silicon monoxide deposits 89, 90 and 91 ensure proper implantation of the guard rings 46. This fabrication results in an enhancement of the gate-to-drain breakdown voltage as well as a reduction of the gate-to-source leakage current. After ion implantation, all oxides are removed resulting in the structure as previously illustrated in FIG. 3. The formation of multiple steps 64, 70 and 80, ensure that the ion implantation connects the gate bus 40' with the lower concentration layer 34.

Although the Figs. Illustrate the sequential formation of steps 64, 70 and 80, it will be appreciated that the steps could be fabricated in the reverse order. By proper deposition of the photoresist, step 80 could be formed first, step 70 second and step 64 last. Further, although three steps are illustrated, more or fewer steps could be incorporated, depending on the thickness of layer 36 and the capability of the ion implantation. Another technique for joining the gate bus 40' with the lower concentration layer 34 is illustrated in FIGS. 11-13.

Figure 11:
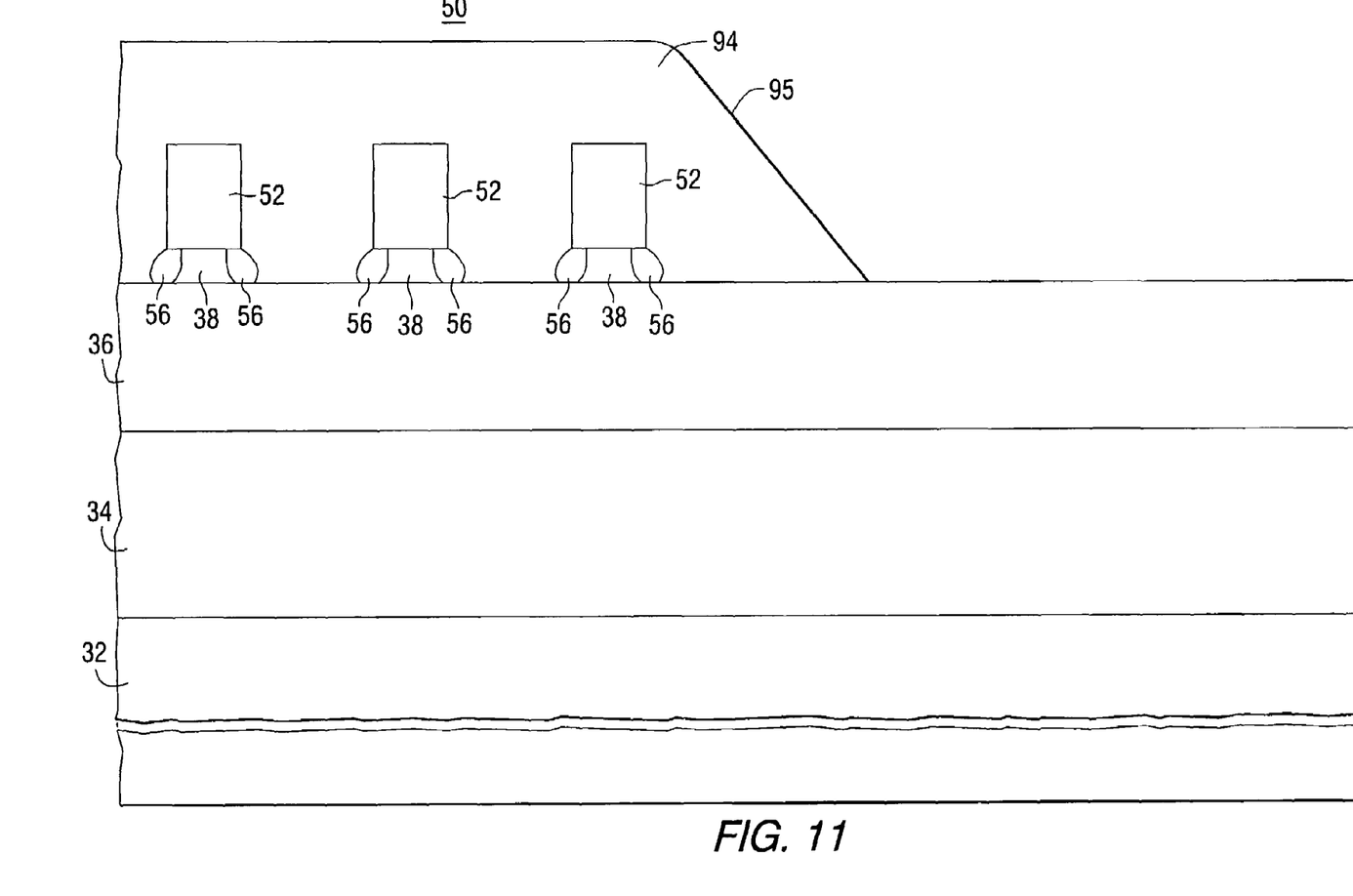
FIGS. 11-13 illustrate another fabrication embodiment.
Figure 12:
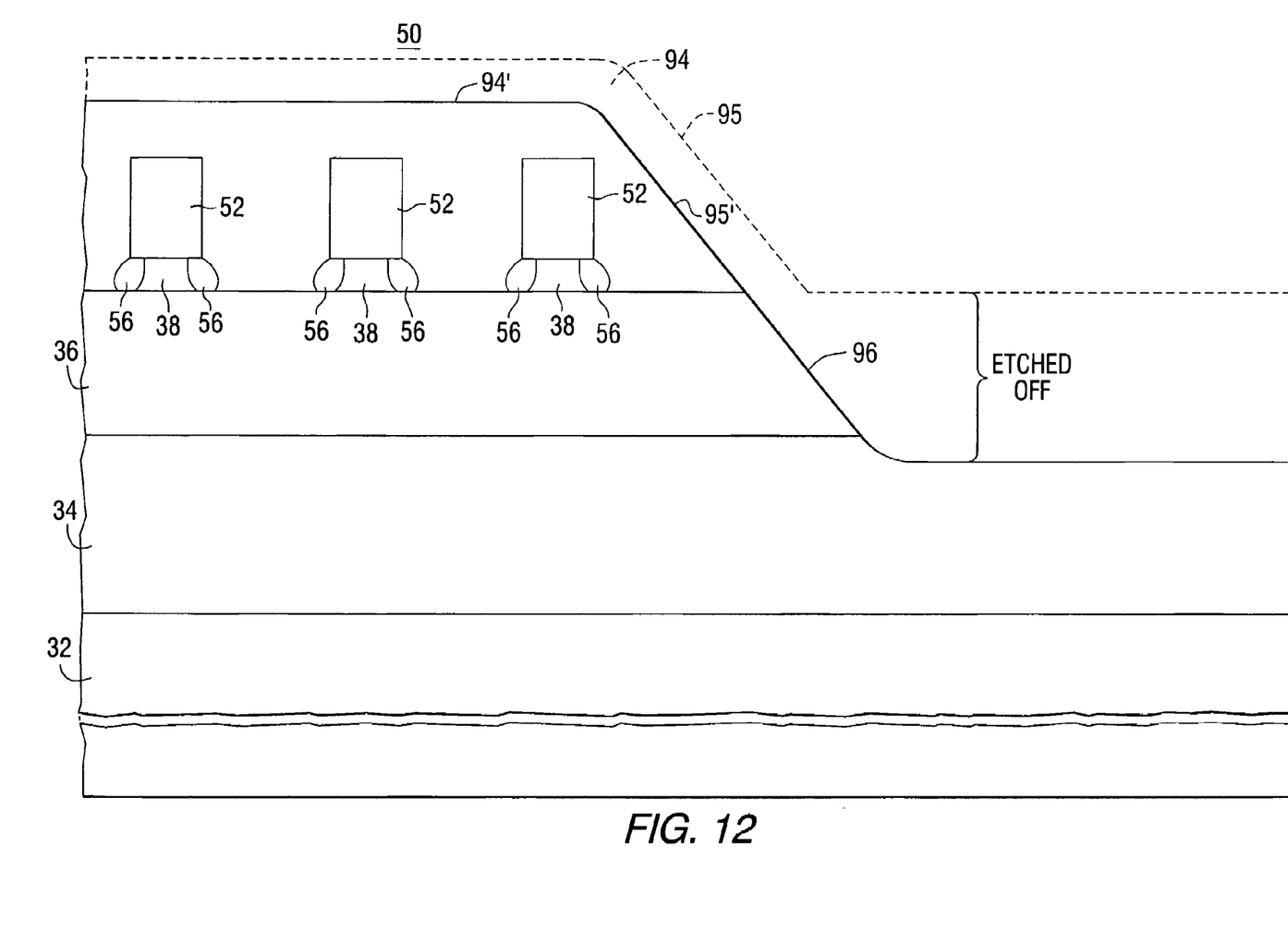

In FIG. 11 a photoresist 94 is applied over the array 50, with the photoresist having a sloping surface 95. The structure is subjected to a RIE which removes a portion of the photoresist as well all of layer 36 and a portion of layer 34, as illustrated in FIG. 12. The surface of photoresist 94 after IRE is designated by the numeral 94' while the sloping surface 95 after RIE is designated by the numeral 95'. The process results in layers 36 and 34 having a sloping surface 96.

Figure 13:
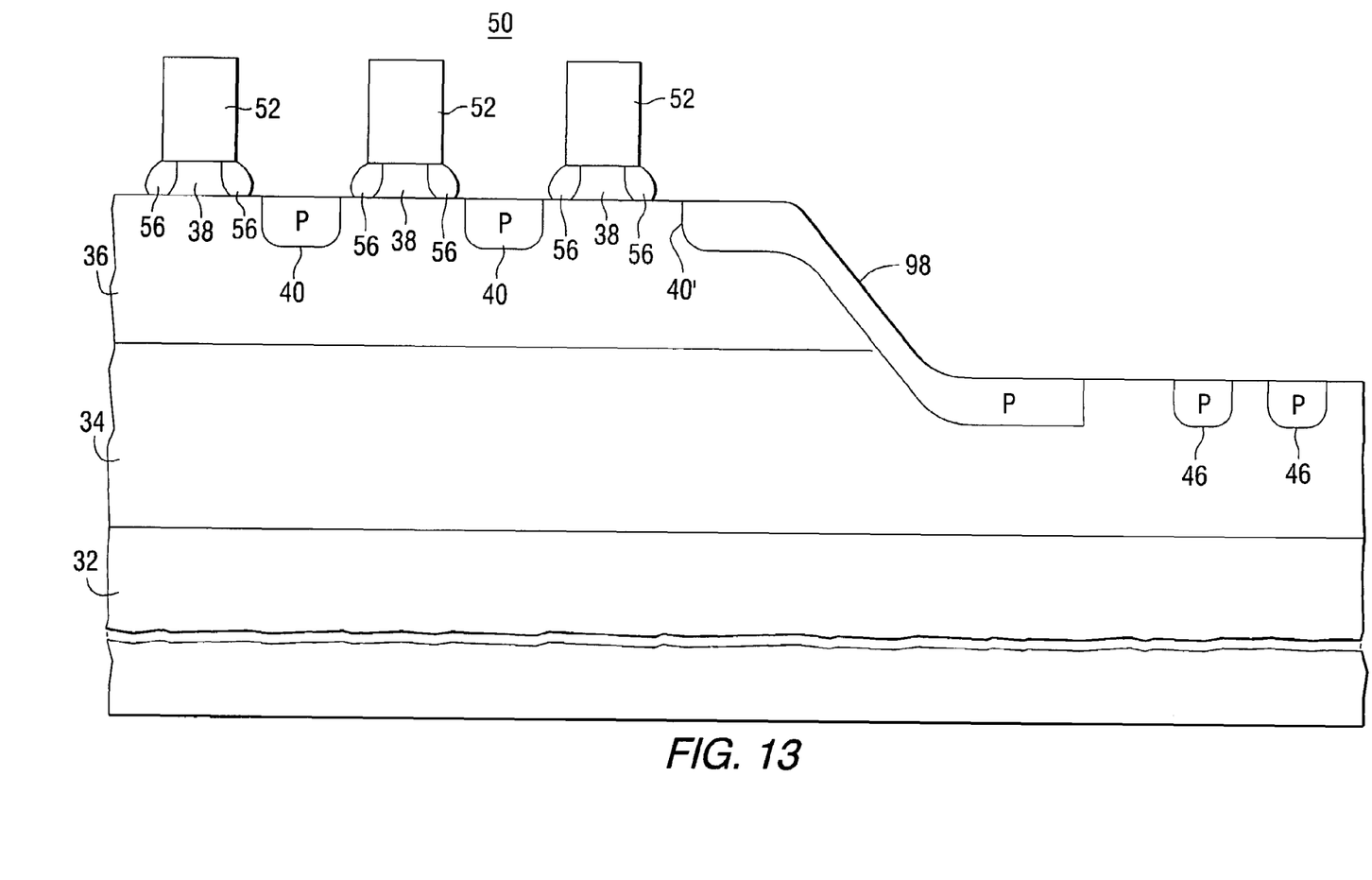

By similar masking techniques previously described, and as illustrated in FIG. 13, ion implantation of gates 40 and guard rings 46 is achieved, as well as sloping ion implantation 98 joining gate bus 40' to the lower concentration layer 34 for superior gate-to-drain breakdown voltage capabilities.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A structure for use in a static induction transistor, comprising:
   a semiconductor body having first and second semiconductor layers on a substrate, said second layer having a dopant concentration of around an order of magnitude higher than the dopant concentration of said first layer;
   a plurality of sources on said second layer;
   a plurality of gates in said second layer, an end one of said gates being connected to all of said plurality of gates and constituting a gate bus;
   said gate bus having an extension connecting said gate bus in said second layer of higher dopant concentration to said first layer of lower dopant concentration.

2. A structure according to claim 1 wherein:
   said gates and said extension are ion implanted regions.

3. A structure according to claim 1 wherein:
   said extension is ion implanted in a series of steps formed in said first and second layers.

4. A structure according to claim 1 wherein:
   said extension is ion implanted in a sloping surface formed in said first and second layers.

5. A structure according to claim 1 wherein:
   said structure includes guard rings formed in said first layer.

6. A structure according to claim 5 wherein:
   said guard rings are ion implanted along with said gates and extension.

7. A structure according to claim 1 wherein:
   said structure is of silicon carbide.

* * * * *